United States Patent
Jung et al.

(10) Patent No.: US 9,101,006 B2
(45) Date of Patent: Aug. 4, 2015

(54) ORGANIC ELECTROLUMINESCENT DEVICE DISPLAY AND METHOD FOR MANUFACTURING THE SAME

(71) Applicant: LG ELECTRONICS INC., Seoul (KR)

(72) Inventors: Mynghee Jung, Seoul (KR); Minseok Choi, Seoul (KR); Taehyeong Kim, Seoul (KR); Jinsan Moon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/212,771

(22) Filed: Mar. 14, 2014

(65) Prior Publication Data

US 2014/0368107 A1    Dec. 18, 2014

(30) Foreign Application Priority Data

Jun. 12, 2013    (KR) .......................... 10-2013-0067199

(51) Int. Cl.
*H01L 51/50* (2006.01)
*H05B 33/04* (2006.01)
*H05B 33/10* (2006.01)
*H01L 51/52* (2006.01)

(52) U.S. Cl.
CPC ............... *H05B 33/04* (2013.01); *H05B 33/10* (2013.01); *H01L 51/5259* (2013.01)

(58) Field of Classification Search
CPC ....................... H01L 51/5259; H01L 51/5237
See application file for complete search history.

(56) References Cited

U.S. PATENT DOCUMENTS

2005/0040763 A1*  2/2005  Yoon et al. .................... 313/512
2008/0042547 A1*  2/2008  Chien et al. ................... 313/495

\* cited by examiner

*Primary Examiner* — Mary Ellen Bowman
(74) *Attorney, Agent, or Firm* — Birch, Stewart, Kolasch & Birch, LLP

(57) ABSTRACT

Disclosed is a light emitting device. More specifically, disclosed are an organic electroluminescent device display and a method for manufacturing the same. The organic electroluminescent device display includes a substrate, an organic electroluminescent device disposed on the substrate, a sealing cap for sealing the organic electroluminescent device, and a getter disposed inside the sealing cap, the getter comprising a graphene layer.

20 Claims, 3 Drawing Sheets

ORGANIC ELECTROLUMINESCENT DEVICE DISPLAY AND METHOD FOR MANUFACTURING THE SAME

Pursuant to 35 U.S.C. §119(a), this application claims the benefit of Korean Patent Application No. 10-2013-0067199, filed on Jun. 12, 2013, which is hereby incorporated by reference as if fully set forth herein.

BACKGROUND OF THE INVENTION

1. Field of the Invention

The present invention relates to a light emitting device and more specifically, to an organic electroluminescent device display and a method for manufacturing the same.

2. Discussion of the Related Art

An organic electroluminescent device emits light when excitons formed by recombination of electrons and holes injected into a light emitting layer from an electron injection electrode (cathode) and a hole injection electrode (anode) fall to ground state.

Such an organic electroluminescent device has high-quality panel properties including low power consumption, high brightness, high reaction speed and low weight, and attracts much attention as a next-generation display useful for most electronic application products such as mobile communication terminals, car navigation systems (CNSs), PDAs and PCs.

In addition, lightings using organic electroluminescent devices are considered to be an ideal candidate for replacement of LED lightings as well as incandescent lamps and fluorescent lamps and research associated with this is actively underway.

There is a need for development of sealing processes in order to improve lifespan of organic electroluminescent devices. In particular, it is necessary to prevent oxidization of an electrode portion by moisture present in the air when devices are exposed to the air.

Meanwhile, graphene has considerably stable and superior electrical, mechanical and chemical properties as well as excellent conductivity and thus more rapidly carries electrons than silicon and enables application of higher electrical current than copper. These behaviors of graphene were demonstrated through experimentation based on discovery of a method of separating graphene from graphite in 2004 and have been actively researched to date.

Such graphene attracts much attention as a base material for electrical circuits because it may be produced over large areas and has electrical, mechanical, chemical stability as well as excellent conductivity.

SUMMARY OF THE INVENTION

Accordingly, the present invention is directed to an organic electroluminescent device display and a method for manufacturing the same that substantially obviate one or more problems due to limitations and disadvantages of the related art.

One object of the present invention is to provide a method for manufacturing an organic electroluminescent device display and a method for manufacturing the same to improve performance of a getter and thereby increase lifespan.

Another object of the present invention is to provide a method for manufacturing an organic electroluminescent device display and a method for manufacturing the same to prevent permeation of gases and thereby increase lifespan.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent device display includes a substrate, an organic electroluminescent device disposed on the substrate, a sealing cap for sealing the organic electroluminescent device, and a getter disposed inside the sealing cap, the getter including a graphene layer.

In accordance with another aspect of the present invention, an organic electroluminescent device display includes a substrate, an organic electroluminescent device disposed on the substrate, a sealing cap for sealing the organic electroluminescent device, a sealant disposed between the sealing cap and the substrate, the sealant including graphene, and a getter disposed inside the sealing cap, the getter including a graphene layer.

In accordance with another aspect of the present invention, a method for manufacturing an organic electroluminescent device display includes preparing an organic electroluminescent device disposed on a substrate, forming a graphene layer on a getter layer containing a getter substance to produce a getter, and bonding the getter to a sealing cap to seal the organic electroluminescent device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Reference will now be made in detail to specific embodiments of the present invention, examples of which are illustrated in the accompanying drawings.

However, the present invention allows various modifications and variations and specific embodiments thereof are exemplified with reference to drawings and will be described in detail. The present invention includes modifications, variations, equivalents, and substitutions compliant with the spirit or scope of the present invention defined by the appended claims and should not be construed as limited to the embodiments set forth herein.

It will be understood that when an element such as a layer, area, or substrate is referred to as being "on" another element, it may be directly on the element, or one or more intervening elements may also be present.

In addition, it will be understood that although terms such as "first" and "second" may be used herein to describe elements, components, areas, layers and/or regions, the elements, components, areas, layers and/or regions should not be limited by these terms.

Figure 1:
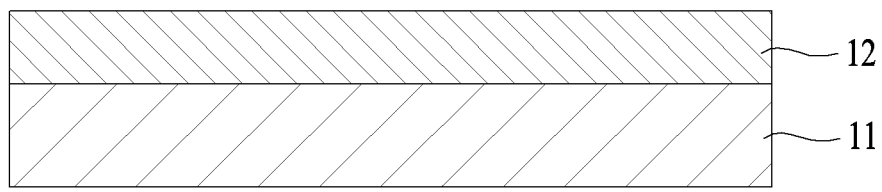
FIG. 1 is a sectional view illustrating an example of a getter.

FIG. 1 is a sectional view illustrating an example of a getter useful for an organic electroluminescent device display.

As shown in FIG. 1, the getter 10 is a member which absorbs exterior moisture and oxygen and includes a getter layer 11 containing a getter substance and a graphene layer 12 disposed thereon.

The getter layer 11 may contain a variety of getter agents such as a getter sheet or a getter paste.

The graphene layer 12 may be formed using a variety of graphene materials such as thin film graphene formed on a catalyst metal, graphene oxide or graphene flake formed using graphene oxide.

For example, the formation of the graphene layer 12 containing thin film graphene may be carried out using chemical vapor deposition (CVD).

Chemical vapor deposition is a method which grows the graphene layer 12 by placing the catalyst metal (not shown) in a chamber (not shown) and supplying a carbon source to the chamber under suitable growth conditions.

Examples of carbon source include gas-type carbon sources such as methane ($CH_4$) and acetylene ($C_2H_2$), solid-type carbon sources such as powders and polymers, and liquid-type carbon sources such as bubbling alcohol.

In addition, various carbon sources such as ethane, ethylene, ethanol, acetylene, propane, butane, butadiene, pentane, pentene, cyclopentadiene, hexane, cyclohexane, benzene and toluene may be used.

The catalyst metal may be selected from metals including Ni, Co, Fe, Pt, Au, Al, Cr, Cu, Mg, Mn, Mo, Rh, Si, Ta, Ti, W, U, V, Zr and the like.

As such, the getter 10 may be manufactured by transferring the graphene layer 12 formed on the catalyst metal to the getter layer 11.

In addition, the graphene layer 12 may contain graphene oxide or graphene flake.

Graphene oxide is a form of carbon particles which are oxidized with an acid. Graphene oxide may be produced by oxidizing graphite with a strong acid such as sulfuric acid. If necessary, a mixture of sulfuric acid with a hydrogen peroxide solution may be used for oxidization.

Graphite has a multi-layered sheet structure. Graphite oxidized upon addition of a strong acid thereto may be produced in the form of monolayered particles. This form is referred to graphene oxide and generally has a powder flake form.

As such, an exfoliation (detachment) process is required for production of graphite oxide having a multi-layered sheet structure and then conversion of the graphite oxide into graphene oxide.

That is, the multilayer graphite oxide is exfoliated (detached) into monolayer graphene oxide through addition of mechanical force to the graphite oxide.

The process of exfoliating the multilayer graphite oxide to form graphene oxide may be carried out in a liquid phase. That is, a solution of graphene oxide, which is exfoliated from graphite oxide, is obtained by application of mechanical force to a dispersion of the graphite oxide.

The graphene oxide thus obtained is reduced to obtain a graphene flake (powder).

The graphene layer 12 has mechanical or chemical stability and has a hexagonal layered structure containing carbon, thus aiding in moisture absorption and deoxygenation of the getter layer 11 when configured with the getter layer 11.

In addition, graphene is particularly produced in a hydrophilic or hydrophobic form and thus functions to block permeation of moisture or absorb the same.

For example, graphene oxide may enhance moisture absorption and thin film graphene may be used as a material for blocking permeation of moisture, but the present invention is not limited thereto.

Figure 2:
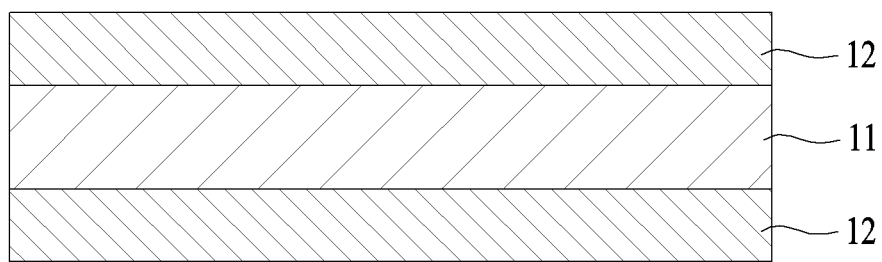
FIG. 2 is a sectional view illustrating another example of a getter.

As shown in FIG. 2, the graphene layer 12 may be provided on both surfaces of the getter layer 11.

As such, the graphene layer 12 disposed on both surfaces of the getter layer 11 may help the getter 10 to absorb moisture and oxygen.

Figure 3:
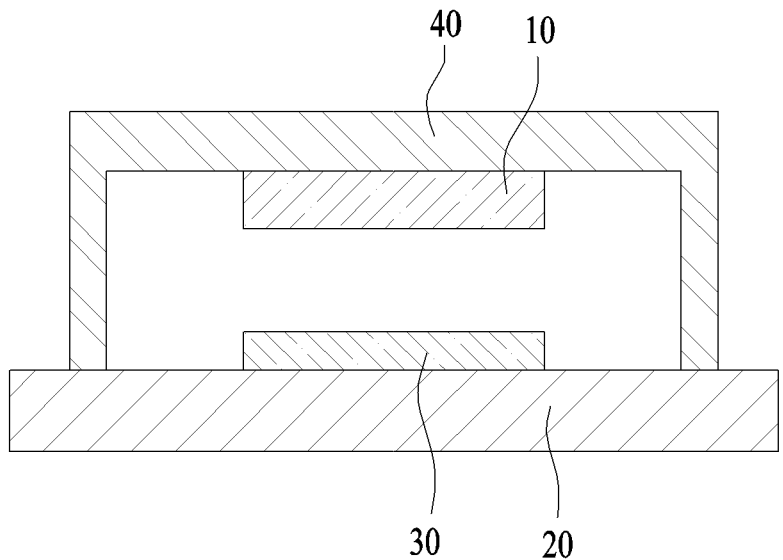
FIG. 3 is a sectional view illustrating an example of an organic electroluminescent device display.

FIG. 3 is a sectional view illustrating an example of an organic electroluminescent device display including the getter.

As shown in FIG. 3, the organic electroluminescent device display includes a substrate 20, an organic electroluminescent device 30 disposed on the substrate 20, and a sealing cap 40 for sealing the organic electroluminescent device 30.

The organic electroluminescent device 30 is primarily protected from oxygen and moisture through the sealing cap 40.

The getter 10 including the graphene 12 may be disposed inside the sealing cap 40.

As shown in the drawing, the getter 10 may be disposed on an inside surface of the sealing cap 40 or be disposed at a position opposite to the organic electroluminescent device 30.

Figure 4:
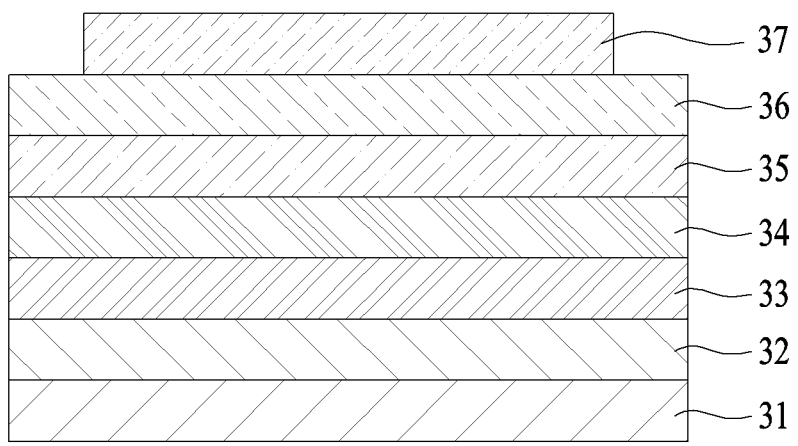
FIG. 4 is a sectional view illustrating an example of an organic electroluminescent device.

As shown in FIG. 4, the organic electroluminescent device 30 includes an anode 31 disposed on the substrate 20, a plurality of organic light-emitting layers 32, 33, 34, 35 and 36 disposed on the anode 31, and a cathode 37 disposed on the organic light-emitting layers 32, 33, 34, 35 and 36.

The organic electroluminescent device emits light upon receiving power through the anode 31 and the cathode 37.

The substrate 20 may be a glass, plastic, metal or the like and a transparent substrate may be used as the substrate 20 when light emits in a direction of the substrate 20.

The organic light-emitting layers may include a hole injection layer 32, a hole transport layer 33, an emission layer 34, an electron transport layer 35 and an electron injection layer 36.

The hole injection layer 32 minimizes reduction in efficiency and lifespan caused by voltage drop generated during operation of lighting devices, when it is formed by laminating a plurality of organic layers or an organic layer and an inorganic layer to considerably small thicknesses.

That is, hole injection may be facilitated in order to minimize the difference in energy between the respective layers so that voltage drop generated upon operation is minimized.

The organic light-emitting layer may include a light emitting layer 34 to render light of a variety of colors. In particular, the organic light-emitting layer may include the light emitting layer 34 emitting blue light for lighting applications. The organic light-emitting layer may further include a wavelength conversion layer (not shown) to convert a wavelength of blue light.

Hereinafter, description of the organic electroluminescent device 30 is omitted.

As described above, the getter 10 improves absorption of moisture and oxygen, based on the action of the graphene layer 12, thus effectively preventing oxidization of electrodes, that is, the anode 31 and the cathode 37 included in the organic electroluminescent device 30.

In addition, the getter 10 exhibits improved drying capacity and blocks permeation of gases, thus effectively protecting the organic light-emitting layers 32, 33, 34, 35 and 36 vulnerable to moisture and improving lifespan of devices.

Figure 5:
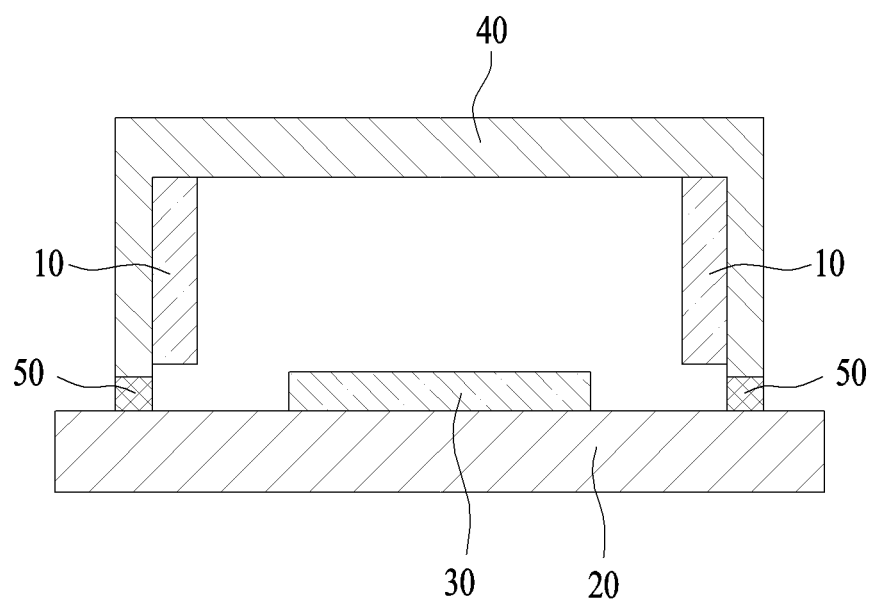
FIG. 5 is a sectional view illustrating another example of an organic electroluminescent device display.

Meanwhile, as shown in FIG. 5, the getter 10 may be disposed on a side surface of the sealing cap 40, but the present invention is not limited thereto.

The getter 10 disposed on the side surface of the sealing cap 40 does not reduce a light emission area when the organic electroluminescent device 30 emits light toward a front surface.

In addition, the organic electroluminescent device 30 may further include a sealant 50 disposed between the substrate 20 and the sealing cap 40. The sealant 50 may contain graphene.

As described above, the graphene blocks permeation of gases. Incorporation of graphene into the sealant 50 enables sealing the gap between the substrate 20 and the sealing cap 40 which may be vulnerable in a sealing structure.

A method for manufacturing the organic electroluminescent device display will be described in brief.

First, the organic electroluminescent device 30 is prepared on the substrate 20.

The graphene layer 12 is formed using one of thin film graphene, graphene flake and graphene oxide and is transferred to the getter layer 11 to manufacture the getter 10 containing graphene.

These two steps may be performed in reverse order.

Then, the getter 10 is adhered to the sealing cap 40 and the sealing cap 40 is mounted on the substrate 20, thereby sealing the organic electroluminescent device 30 with the sealing cap 40.

The sealing of the substrate 20 with the sealing cap 40 may be carried out by forming the sealant 50 containing graphene between the substrate 20 and the sealing cap 40.

As apparent from fore-going, the organic electroluminescent device 30 is effectively protected using the getter 10 or the sealant 50 containing graphene and lifespan of a display device using the organic electroluminescent device 30 is thus improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device display comprising:
   a substrate;
   an organic electroluminescent device disposed on the substrate;
   a sealing cap for sealing the organic electroluminescent device; and
   a getter disposed inside the sealing cap, the getter comprising a graphene layer.

2. The organic electroluminescent device display according to claim 1, wherein the getter comprises a getter layer bonded to the graphene layer.

3. The organic electroluminescent device display according to claim 2, wherein the graphene layer is disposed on both surfaces of the getter layer.

4. The organic electroluminescent device display according to claim 1, wherein the graphene layer comprises graphene oxide.

5. The organic electroluminescent device display according to claim 1, further comprising a sealant disposed between the substrate and the sealing cap.

6. The organic electroluminescent device display according to claim 5, wherein the sealant comprises graphene.

7. The organic electroluminescent device display according to claim 1, wherein the getter is disposed on a side surface of the sealing cap.

8. The organic electroluminescent device display according to claim 1, wherein the organic electroluminescent device further comprises a wavelength conversion layer.

9. An organic electroluminescent device display comprising:
   a substrate;
   an organic electroluminescent device disposed on the substrate;
   a sealing cap for sealing the organic electroluminescent device;
   a sealant disposed between the sealing cap and the substrate, the sealant comprising graphene; and
   a getter disposed inside the sealing cap, the getter comprising a graphene layer.

10. The organic electroluminescent device display according to claim 9, wherein the getter comprises a getter layer bonded to the graphene layer.

11. The organic electroluminescent device display according to claim 10, wherein the graphene layer is disposed on both surfaces of the getter layer.

12. The organic electroluminescent device display according to claim 9, wherein the graphene layer comprises graphene oxide.

13. The organic electroluminescent device display according to claim 9, wherein the getter is disposed on a side surface of the sealing cap.

14. The organic electroluminescent device display according to claim 9, wherein the organic electroluminescent device further comprises a wavelength conversion layer.

15. A method for manufacturing an organic electroluminescent device display comprising:
   preparing an organic electroluminescent device disposed on a substrate;
   forming a graphene layer on a getter layer containing a getter substance to produce a getter; and
   bonding the getter to a sealing cap to seal the organic electroluminescent device.

16. The method according to claim 15, wherein the production of the getter is carried out by forming the graphene layer on at least one surface of the getter layer.

17. The method according to claim 15, wherein the graphene layer comprises graphene oxide.

18. The method according to claim 15, wherein the production of the getter comprises forming the graphene layer and transferring the graphene layer to the getter layer.

19. The method according to claim 15, wherein the bonding of the getter to the sealing cap to seal the organic electroluminescent device is carried out by bonding the sealing cap to the substrate using a sealant.

20. The method according to claim 19, wherein the sealant comprises graphene.

* * * * *